(12) United States Patent
Holec et al.

(10) Patent No.: US 8,410,720 B2
(45) Date of Patent: Apr. 2, 2013

(54) SOLID STATE LIGHTING CIRCUIT AND CONTROLS

(75) Inventors: Henry V. Holec, Mendota Heights, MN (US); Wm. Todd Crandell, Minnetonka, MN (US)

(73) Assignee: Metrospec Technology, LLC., Mendota Heights, MN (US)

( * ) Notice: Subject to any disclaimer, the term of this patent is extended or adjusted under 35 U.S.C. 154(b) by 417 days.

(21) Appl. No.: 12/419,879

(22) Filed: Apr. 7, 2009

(65) Prior Publication Data

US 2009/0251068 A1 Oct. 8, 2009

Related U.S. Application Data

(60) Provisional application No. 61/043,006, filed on Apr. 7, 2008.

(51) Int. Cl.
H05B 37/02 (2006.01)
(52) U.S. Cl. .............................. 315/294; 315/209 R
(58) Field of Classification Search .................. None
See application file for complete search history.

(56) References Cited

U.S. PATENT DOCUMENTS

| | | | |
|---|---|---|---|
| 2,697,811 A * | 12/1954 | Deming ................. | 323/291 |
| 2,731,609 A | 1/1956 | Sobel, III | |
| 3,086,189 A | 4/1963 | Robbins | |
| 3,270,251 A | 8/1966 | Evans | |
| 3,401,369 A | 9/1968 | Plamateer et al. | |
| 4,250,536 A | 2/1981 | Barringer et al. | |
| 4,526,432 A | 7/1985 | Cronin et al. | |
| 4,533,188 A | 8/1985 | Miniet | |
| 4,618,194 A | 10/1986 | Kwilos | |
| 4,795,079 A | 1/1989 | Yamada | |
| 4,991,290 A | 2/1991 | MacKay | |
| 5,001,605 A | 3/1991 | Savagian et al. | |
| 5,176,255 A | 1/1993 | Seidler | |
| 5,375,044 A | 12/1994 | Guritz | |
| 5,404,044 A | 4/1995 | Booth et al. | |
| 5,440,454 A | 8/1995 | Hashimoto et al. | |
| 5,511,719 A | 4/1996 | Miyake et al. | |
| 5,575,554 A | 11/1996 | Guritz | |
| 5,920,465 A | 7/1999 | Tanaka | |
| 6,095,405 A | 8/2000 | Kim et al. | |
| 6,113,248 A | 9/2000 | Mistopoulos et al. | |
| 6,137,816 A * | 10/2000 | Kinbara ................ | 372/29.012 |
| 6,239,716 B1 * | 5/2001 | Pross et al. .......... | 340/815.4 |
| 6,299,337 B1 | 10/2001 | Bachl et al. | |
| 6,372,997 B1 | 4/2002 | Hill et al. | |

(Continued)

FOREIGN PATENT DOCUMENTS

JP 01319993 12/1989
JP 05090726 4/1993

OTHER PUBLICATIONS

"File History", for co-pending U.S. Appl. No. 12/372,499, "Printed Circuit Board Flexible Interconnect Design" filed Feb. 17, 2009 (254 pages).

(Continued)

*Primary Examiner* — Crystal L Hammond
(74) *Attorney, Agent, or Firm* — Pauly, Devries Smith & Deffner, L.L.C.

(57) ABSTRACT

In some embodiments, a solid state lighting circuit may include one or more of the following features: (a) a plurality of emitters operably connected to a power supply (b) the power supply operably coupled in series with a current limiting device, where one or more of the emitters is bypassed with a switched circuit, and (c) at least one MOSFET switch operably coupled to the voltage divider circuit.

10 Claims, 6 Drawing Sheets

U.S. PATENT DOCUMENTS

| | | | |
|---|---|---|---|
| 6,428,189 B1 | 8/2002 | Hochstein | |
| 6,449,836 B1 | 9/2002 | Miyake et al. | |
| 6,481,874 B2 | 11/2002 | Petroski | |
| 6,517,218 B2 | 2/2003 | Hochstein | |
| 6,601,292 B2 | 8/2003 | Li et al. | |
| 6,657,297 B1 | 12/2003 | Jewram et al. | |
| 6,729,888 B2 | 5/2004 | Imaeda | |
| 6,784,027 B2 | 8/2004 | Streubel et al. | |
| 6,833,526 B2 | 12/2004 | Sinkunas et al. | |
| 6,846,094 B2 | 1/2005 | Luk | |
| 6,851,831 B2 | 2/2005 | Karlicek, Jr. et al. | |
| 6,897,622 B2* | 5/2005 | Lister | 315/291 |
| 6,898,084 B2 | 5/2005 | Misra | |
| 6,936,855 B1 | 8/2005 | Harrah | |
| 6,966,674 B2 | 11/2005 | Tsai | |
| 6,991,473 B1 | 1/2006 | Balcome et al. | |
| 6,996,674 B2 | 2/2006 | Chiu et al. | |
| 7,023,147 B2* | 4/2006 | Colby et al. | 315/291 |
| 7,114,831 B2 | 10/2006 | Popovich et al. | |
| 7,149,097 B1 | 12/2006 | Shteynberg et al. | |
| 7,253,449 B2 | 8/2007 | Wu | |
| 7,262,438 B2 | 8/2007 | Mok et al. | |
| 7,276,861 B1 | 10/2007 | Shteynberg et al. | |
| 7,284,882 B2 | 10/2007 | Burkholder | |
| 7,331,796 B2 | 2/2008 | Hougham et al. | |
| 7,377,669 B2 | 5/2008 | Farmer et al. | |
| 7,394,027 B2 | 7/2008 | Kaluzni et al. | |
| 7,397,068 B2 | 7/2008 | Park et al. | |
| 7,448,923 B2 | 11/2008 | Uka | |
| 7,502,846 B2 | 3/2009 | McCall | |
| 7,573,210 B2 | 8/2009 | Ashdown et al. | |
| 7,583,035 B2 | 9/2009 | Shteynberg et al. | |
| 7,598,685 B1 | 10/2009 | Shteynberg et al. | |
| 7,656,103 B2 | 2/2010 | Shteynberg et al. | |
| 7,665,999 B2 | 2/2010 | Hougham et al. | |
| 7,696,628 B2 | 4/2010 | Ikeuchi et al. | |
| 7,710,047 B2 | 5/2010 | Shteynberg et al. | |
| 7,710,050 B2* | 5/2010 | Preston et al. | 315/312 |
| 7,800,315 B2 | 9/2010 | Shteynberg et al. | |
| 7,852,009 B2 | 12/2010 | Coleman et al. | |
| 7,852,300 B2 | 12/2010 | Shteynberg et al. | |
| 7,880,400 B2 | 2/2011 | Zhou et al. | |
| 7,888,881 B2 | 2/2011 | Shteynberg et al. | |
| 7,902,769 B2 | 3/2011 | Shteynberg et al. | |
| 7,902,771 B2 | 3/2011 | Shteynberg et al. | |
| 7,952,294 B2 | 5/2011 | Shteynberg et al. | |
| 7,956,554 B2 | 6/2011 | Shteynberg et al. | |
| 7,980,863 B1 | 7/2011 | Holec et al. | |
| 8,004,211 B2* | 8/2011 | Van Erp | 315/294 |
| 8,007,286 B1 | 8/2011 | Holec et al. | |
| 8,067,896 B2 | 11/2011 | Shteynberg et al. | |
| 8,075,477 B2 | 12/2011 | Nakamura et al. | |
| 8,124,429 B2 | 2/2012 | Norman | |
| 8,143,631 B2 | 3/2012 | Crandell et al. | |
| 8,232,735 B2 | 7/2012 | Shteynberg et al. | |
| 8,242,704 B2 | 8/2012 | Lethellier | |
| 8,253,349 B2 | 8/2012 | Shteynberg et al. | |
| 8,253,666 B2 | 8/2012 | Shteynberg et al. | |
| 8,264,169 B2 | 9/2012 | Shteynberg et al. | |
| 8,264,448 B2 | 9/2012 | Shteynberg et al. | |
| 2003/0052594 A1 | 3/2003 | Matsui et al. | |
| 2003/0072153 A1 | 4/2003 | Matsui et al. | |
| 2003/0079341 A1 | 5/2003 | Miyake et al. | |
| 2003/0094305 A1 | 5/2003 | Ueda | |
| 2003/0098339 A1 | 5/2003 | Totani et al. | |
| 2003/0193789 A1 | 10/2003 | Karlicek, Jr. | |
| 2003/0199122 A1 | 10/2003 | Wada et al. | |
| 2003/0223210 A1 | 12/2003 | Chin | |
| 2004/0060969 A1 | 4/2004 | Imai et al. | |
| 2004/0087190 A1 | 5/2004 | Miyazawa et al. | |
| 2004/0090403 A1* | 5/2004 | Huang | 345/82 |
| 2004/0239243 A1 | 12/2004 | Roberts et al. | |
| 2004/0264148 A1 | 12/2004 | Burdick, Jr. et al. | |
| 2005/0133800 A1 | 6/2005 | Park et al. | |
| 2005/0272276 A1 | 12/2005 | Ooyabu | |
| 2006/0038542 A1 | 2/2006 | Park et al. | |
| 2006/0245174 A1 | 11/2006 | Ashdown et al. | |
| 2007/0157464 A1 | 7/2007 | Jeon et al. | |
| 2007/0171145 A1 | 7/2007 | Coleman et al. | |
| 2007/0210722 A1* | 9/2007 | Konno et al. | 315/185 S |
| 2007/0257623 A1* | 11/2007 | Johnson et al. | 315/193 |
| 2008/0143379 A1 | 6/2008 | Norman | |
| 2008/0191642 A1* | 8/2008 | Slot et al. | 315/295 |
| 2008/0249363 A1 | 10/2008 | Nakamura et al. | |
| 2008/0254653 A1 | 10/2008 | Uka | |
| 2008/0310141 A1 | 12/2008 | Mezouari | |
| 2008/0311771 A1 | 12/2008 | Cho | |
| 2009/0029570 A1 | 1/2009 | Ikeuchi et al. | |
| 2009/0079357 A1 | 3/2009 | Shteynberg et al. | |
| 2009/0117373 A1 | 5/2009 | Wisniewski et al. | |
| 2009/0205200 A1 | 8/2009 | Rosenblatt et al. | |
| 2009/0226656 A1 | 9/2009 | Crandell et al. | |
| 2009/0230883 A1* | 9/2009 | Haug | 315/297 |
| 2009/0301544 A1 | 12/2009 | Minelli | |
| 2010/0026208 A1 | 2/2010 | Shteynberg et al. | |
| 2010/0109536 A1 | 5/2010 | Jung et al. | |
| 2010/0110682 A1 | 5/2010 | Jung et al. | |
| 2010/0213859 A1 | 8/2010 | Shteynberg et al. | |
| 2010/0220046 A1 | 9/2010 | Plötz et al. | |
| 2010/0308738 A1 | 12/2010 | Shteynberg et al. | |
| 2010/0308739 A1 | 12/2010 | Shteynberg et al. | |
| 2011/0096545 A1 | 4/2011 | Chang | |
| 2011/0115411 A1 | 5/2011 | Shteynberg et al. | |
| 2011/0121754 A1 | 5/2011 | Shteynberg et al. | |
| 2011/0309759 A1 | 12/2011 | Shteynberg et al. | |
| 2011/0311789 A1 | 12/2011 | Loy et al. | |
| 2012/0081009 A1 | 4/2012 | Shteynberg et al. | |
| 2012/0081018 A1 | 4/2012 | Shteynberg et al. | |
| 2012/0162990 A1 | 6/2012 | Crandell et al. | |

OTHER PUBLICATIONS

"File History", for co-pending U.S. Appl. No. 12/406,761, "Printed Circuit Board Interconnect Construction," filed Mar. 18, 2009 (244 pages).

"3M Thermally Conductive Adhesive Transfer Tapes", 3M Electronic Adhesives and Specialties Department Engineered Adhesives Devision Sep. 2002 , 1.

"3M Thermally Conductive Adhesive Transfer Tapes—Technical Data", *Electronic Adhesives and Specialties Department Engineered Adhesives Division* Sep. 2002 , 1-6.

"Custom LUXEON Design Guide", *Application Brief AB12* Mar. 2006 , 1-14.

"Data Sheet—DRAGONtape: DT6", Sep. 18, 2007 , 1-4.

"Data Sheet—LINEARlight POWER Flex: LM10P", OSRAM Sylvania May 23, 2007 , 1-4.

"DRAGONtape", *OSRAM Product Information Bulletin* Nov. 2005 , 1-4.

"FLEX Connectors User's Guide", OSRAM Sylvania Oct. 2007 , 1-6.

"FR406: High Performance Epoxy Laminate and Prepreg", http://www.isola-group.com/en/products/name/details.shtl?13 Mar. 3, 2008 , 1.

"High Performance Epoxy Laminate and Prepreg", Isola Mar. 16, 2007 , 1-3.

"IPC-4101B: Specification for Base Materials for Rigid and Multilayer Printed Boards", IPC Mar. 2006 , 1-109.

"Kapton Polyimide Film", http://www2.dupont.com/Kapton/en_US/index.html. DuPont Electronics Feb. 26, 2008 , 1-9.

"Linear Products", http://www.sylvanaia.com/BusinessProducts/Innovations/LED+Systems/Linear/OSRAM SYLVANIA 2004 , 1.

"LINEARlight Flex & POWER FLEX LED Systems", http://www/sylvania.com/AboutUs/Pressxpress/Innovation/LightingNews(US)/20.07/USLi...OSRAM Sylvania Sep. 2007 , 1-3.

"LINEARlight Flex Topled: Flexible LED Strip", *Osran Sylvania LED Systems Specification Guide 2007* 2007 , p. 100.

"LINEARlight POWER FLEX: Flexible High Light Output LED Modules", OSRAM Sylvania Apr. 2008.

"LINEARlight POWER FLEX: Flexible LED Strip", *Osran Sylvania LED Systems Specification Guide 2007* 2007 , p. 96.

"Nichia Application Note", Oct. 31, 2003 , 5.

"Non Final Office Action Received", mailed Mar. 5, 2012 in co pending U.S. Appl. No. 13/190,639 , "Printed Circuit Board Interconnect Construction"(12 pages). , 12.

"Notice of Allowance Received", mailed Nov. 16, 2011 in co-pending U.S. Appl. No. 12/043,424, "*Layered Structure for Use With High Power Light Emitting Diode Systems*," (9 pages)., 9.

"NUD4001—High Current LED Driver", *Semiconductor Components Industries, LLC* http://onsemi.com Jun. 2006, 1-8.

"Product Information Bulletin DRAGONtape", OSRAM Sylvania 2007, 1-2.

"Product Information Bulletin HF2STick XB: Hi-Flux 2nd Generation Module", OSRAM Sylvania Jan. 2008, 1-4.

"Restriction Requirement Received", mailed Sep. 7, 2011 in co-pending U.S. Appl. No. 13/190,639, "*Printed Circuit Board Interconnect Construction*" (6 pages)., 6.

"Specifications for Nichia Chip Type Warm White LED Model: NS6L083T", No. STSE-CC6063A, <Cat.No. 060609> Nichia Corporation, 1-3.

"Specifications for Nichia Chip Type White LED Model: NS6W083AT", No. STSE-CC7134, <Cat.No. 070706> Nichia Corporation, 1-14.

"TechniMask ISR 1000 Series", http://www.technic.com/pwb/solderisr1000.htm Technic, Inc. 2003, 1.

"Thermal Management for LED Applications Solutions Guide", *The Bergquist Company*, 1-6

"T-Lam System—Thermally Conductive Circuit Board Materials", http://www.lairdtech.com/pages/products/T-Lam-System.asp Feb. 21, 2008, 1-7.

Murray, Cameron T. et al., "3M Thermally Conductive Tapes", 3M Electronic Markets Materials Division Mar. 16, 2004, 1-39.

O'Malley, Kleran, "Using the NUD4001 to Drive High Current LEDs", http://onsemi.com Feb. 2005, 1-4.

"Derwent-Acc-No. 1984-298425", corresponds to JP-59-186388A (1984).

"Derwent-Acc-No. 2010-J09039", corresponds to JP-2010-153549A (1984).

"Final Office Action", mailed Aug. 7, 2012 in U.S. Appl. No. 13/190,639, "Interconnectable Circuit Boards," (25 pages).

"Non-Final Office Action", mailed Oct. 1, 2012 in U.S. Appl. No. 13/411,322, "Layered Structure for use With High Power Light Emitting Diode Systems," (18 pages).

"Non-Final Office Action", mailed Aug. 22, 2012 in co-pending U.S. Appl. No. 13/158,149, "Flexibe Circuit Board Interconnection and Methods," (27 pages).

\* cited by examiner

SOLID STATE LIGHTING CIRCUIT AND CONTROLS

CROSS-REFERENCE TO RELATED APPLICATIONS

The present application claims priority to U.S. Patent Application Ser. No. 61/043,006, filed on Apr. 7, 2008, titled Configurations and Controls for High Power LED Systems, listing Henry V. Holec and Wm. Todd Crandell as co-inventors, herein incorporated by reference in its entirety. The present application is related to co-pending U.S. patent application Ser. No. 12/372,499, filed on Feb. 17, 2009, titled Printed Circuit Board Flexible Interconnect Design, listing Henry V. Holec and Wm. Todd Crandell as co-inventors, and to co-pending U.S. patent application Ser. No. 12/406,761, filed on Mar. 18, 2009, titled Printed Circuit Board Interconnect Construction, listing Henry V. Holec and Wm. Todd Crandell as co-inventors, herein incorporated by reference in their entirety.

FIELD OF THE INVENTION

Embodiments of the present invention relate to designs and methods of efficiently powering and controlling light output for use with light emitting diodes (LED) or other types of emitters in Solid-State Lighting (SSL) applications. In addition, embodiments of the present invention address designs and methods of efficiently accepting variable voltage, variable current and alternating current (AC) power sources for SSL applications.

BACKGROUND OF THE INVENTION

Solid-state lighting (SSL) refers to a type of lighting utilizing light-emitting diodes (LEDs), organic light-emitting diodes (OLEDs) or polymer light-emitting diodes (PLEDs) as sources of illumination rather than electrical filaments, plasma (e.g., used in arc lamps such as fluorescent lamps) or gas. The term "solid-state" refers to the fact light in an LED is emitted from a solid object, a block of semiconductor rather than from a vacuum or gas tube, as is the case in traditional incandescent light bulbs and fluorescent lamps. Compared to incandescent lighting, however, SSL creates visible light with reduced heat generation or parasitic energy dissipation, similar to fluorescent lighting. In addition, its solid-state nature provides for greater resistance to shock, vibration and wear, thereby increasing its lifespan significantly. Solid-state lighting is often used in area lighting, signage, traffic lights and is also used frequently in modern vehicle lights, train marker lights, etc.

The adoption of high power solid state lighting (SSL) or high power LED lighting to global applications, including indoor and outdoor tasks and area lighting, is limited by high system costs relative to the lower costs of less efficient, traditional lighting sources. It is therefore advantageous to further enhance the optical efficiency (and therefore the cost effectiveness) as well as to reduce the power losses (loss mainly as waste heat).

An important factor in the adoption of SSL is the light output efficiencies. While LED efficiency is nearing of fluorescent sources on the order of 60-100 lm/W, LED component costs are relatively high. As a result, SSL system designs focus on optimizing the light output of the SSL fixture in order to minimize the number of LEDs used in the system and the corresponding costs.

In conjunction with the energy efficiency and light control strongly desired of SSL systems, it is also desirable to be able to adjust light output levels and elicit light color control without loosing efficiency. Further, because LEDs are highly non-linear devices in their light intensity response to increased and decreased voltage, complex and potentially energy wasteful circuits are often used to "dim" and control light output of SSL fixtures.

Also, a primary need in SSL applications is high reliability over long periods of life. Solid state components like the CREE XRE LED emitter are sold with the assurance if properly applied and powered, they will produce 50,000 hours or longer useful life. It is very important the circuits used to power and control SSL light sources are themselves highly reliable and long lived.

Typically, power supplies for SSL lighting convert fixed ranges of line voltage (AC) to DC output. After attaining the necessary onset (turn on) voltage, SSL emitter light output (and sometimes color) is highly sensitive to voltage (Vf) applied across the emitter. For this reason, current limiting or controlling devices are often used with SSL circuits. Special power supplies, specifically designed for SSL lighting, are often equipped with current limiting as a built in feature. Dimming controls are optional to these power supplies, but usually come at a premium price and require an external control signal fed through a separate wire into the device (examples include Advance SignPro™ and Xitanium™ series LED Drivers). Externally controlled dimming power supplies require the electrician or fixture designer to add another device and circuit specifically for dimming control such as a low voltage rheostat or potentiometer.

In some cases to gain light output control, the main supply power is interrupted by a digital switch to effect pulse width modulation (PWM) control of average light output. Effectively PWM turns on and off the emitter circuit at a high frequency of repetition relying on visual persistence or persistence of the phosphors (found in many high intensity white LED emitters) to effect dimming. These systems are often associated with varying degrees of flicker or variation of light color. Further, PWM usually requires a separate timing control adding complexity, increasing size, reducing reliability, and consuming extra energy. PWM systems also (because of the switching of currents) create electromagnetic radiation possibly interfering with radio and other electronic devices.

SSL emitters come in a wide variety of colors. In white lighting applications there are several discrete options for color temperature and intensity of SSL emitters. It is often desirable to change net color output of an SSL fixture as either a function of intensity (similar to the color change an incandescent bulb goes through as it is increased in current or voltage) or to elicit special moods or lighting effects (warm light, moon light, sun light, etc.). Commonly, changing color is achieved by having multiple SSL emitters of different colors individually powered and dimmed (per the methods described above) or are simply turned on and off (via a remote switch or series of switches). Some lighting systems (e.g., Color Kinetics series of products) have an additional controller effecting gentle transitions from one color to another by combining dimming with controlled shutoff of individual emitters. However, these systems are generally complex, are costly to manufacture, have a number of points of failure and do not integrate well into existing wiring and dimming control systems used for other types of lighting.

Many existing fixture installations rely on standard AC dimming controls (such as rheostats, variable transformers and SCR or TRIAC chopping circuits) to supply amplitude or voltage waveform modified AC power to affect light output control. These are usually two wire systems (AC supply and return). It is highly desirable to have SSL lighting fixtures and systems compatible with these controls, without the need to rewire and replace existing circuitry.

Solid state lighting systems typically employ individual, strings, or arrays of emitters powered from either a direct current (DC) or alternating current (AC) source. Because SSL emitters are generally highly thermally sensitive and nonlinear as a function of current to voltage applied, and because it is highly desirable to maintain steady light output in most SSL applications (light output is proportional to current passing through the emitters), a variety of methods and circuits are often employed to limit or maintain current flow.

An SSL emitter is often characterized by a voltage level will be needed to start current flow through the device (initial turn on voltage) and by the forward voltage drop of the device at its desired operating current (Vf). Both of these levels are highly variable with temperature, from device to device, and from product to product. For instance, a popular LED manufactured by Nichia (NS6W083AT-E) manifests a Vf range of 3.2 to 4.4 volts at 300 mA and at 25° C. operating temperature. This range increases by ±10 percent as a function of operating temperature. Also, for this and many other devices like it, current will change at 20 to 60 times the rate of voltage change across the device.

In many SSL implementations, resistive devices (sometime referred to as ballast resistors) are placed in series with the emitters to help control current. Resistors are primarily linear in current response to voltage and help to hold a more steady current. Ballast resistors can also be chosen to be much more constant in current to voltage response as a function of temperature. Ballast resistors are simple and inexpensive. However, to achieve current control, resistors consume energy and in most implementations severely affect the energy efficiency of the circuit. Also, resistors do not fully control current variance as a function of voltage variance; they simply reduce the variance to a more linear result.

In many SSL implementation, a current limiting device or circuit (current regulator) is inserted in series with one or more emitters. There are two general types of current regulators, linear and switching.

A linear current regulator acts to change the resistance of the circuit in response to changing voltage by use of a feedback signal, such as detected voltage across a small resistor. A linear current regulator can control the current very accurately in response to voltage and temperature change. Linear regulators are more expensive and may require more components than using simple resistors to control current. And, because linear regulators behave mainly as variable resistors, they can be just as costly in their consumption of energy, particularly if the stacked Vf of the emitters is substantially lower than the voltage applied at the input of the regulator. Voltage drop across the regulator is maintained by converting electrical energy into waste heat. However, in general, linear regulators are simple and very reliable and robust.

Switching regulators also use feedback to control current, however they function quite differently from linear regulators. Inductors or capacitors are used in these regulators to store and recover energy. One or more transistors or switching devices are used to store or discharge energy in response to a feedback signal in order to maintain generally constant current. Switching regulators are never completely efficient, but are much better at conserving energy when the stacked Vf of the emitters is substantially lower (or higher) than the voltage applied at the input of the regulator. However, switching regulators suffer five significant drawbacks. Switching regulators generally involve more components and are almost always more expensive than linear regulators. Switching regulators are not more efficient than linear regulators when small voltage drops are involved. Switching regulators generally produce electromagnetic interference (EMI) and in some cases audible noise as the result of their switching frequency and components. Switch regulators generally require more circuit board area and have taller components than resistors or linear regulators. And, switching regulators are less reliable than other choices because of additional complexity and aging effects and environmental sensitivity of inductive and capacitive storage devices.

Ballast resistors are sometimes used in series with SSL emitters in combination with other current regulation devices to reduce voltage drop (and therefore power and heat dissipation) at the regulator, to reduce the non-linear load of the emitters on the regulator, and to compensate for large Vf differences between emitter loss.

In SSL applications, it is highly desirable to have a power and control circuit which have one or more of the following characteristics: monitor the voltage of the connected power supply or an independent control signal to control the number of emitters currently enabled in each string in accordance with the available power or voltage; work in conjunction with common current regulating devices and circuits to maintain high efficiency by balancing the number of emitters or ballast resistors on the available power or voltage; can be implemented in reference to either the high side (current in) or the low side (current out) of the power supply feeding each emitter string; enable a highly energy efficient system, by matching the number of enabled emitters to the available voltage or power, by minimizing voltage drop across non-light producing power components; enable energy savings because power supplies can be sized smaller since the system adapts to voltage degradation because of wiring, connector and time dependant power supply losses; can be configured to turn on and address either individual emitters or groups of emitters and can precisely control the sequence of turning on emitters as a function of input voltage or a control signal; can maintain light output as a near linear function of voltage; enable control the color mix of emitters turned on or, as light intensity is increased, discretely change the color of light; can be simple and reliable, utilizing high reliability discrete electronic components; respond with highly reproducible color and light output levels; can receive either DC or AC power without heating or performance problems; use AC power sourced through a conventional AC dimming control from line voltage (rheostat, variable transformer, TRIAC (TRIode for Alternating Current) chopping dimmer, etc.), a voltage reducing electronic or magnetic transformer; operate in changing voltage and brown out conditions without damage or shutdown; enable two or more discrete light output settings, each with their own brightness and color selection and provide more than one light output level, one of which is set to a level of light for emergency or safety lighting operating from a backup power source.

BRIEF SUMMARY OF THE INVENTION

In some embodiments, a solid state lighting circuit may include one or more of the following features: (a) a plurality of emitters operably connected to a power supply, and (b) the power supply operably coupled in series with a current limiting device, where one or more of the emitters is bypassed with a switched circuit, and (c) at least one MOSFET switch operably coupled to the voltage divider circuit.

In some embodiments, a solid state lighting circuit may include one or more of the following features: (a) a plurality of emitters operably connected to a power supply, and (b) the power supply operably coupled in series with a current limiting device, where one or more ballast can be bypassed with a switched circuit.

DETAILED DESCRIPTION

Figure 1:
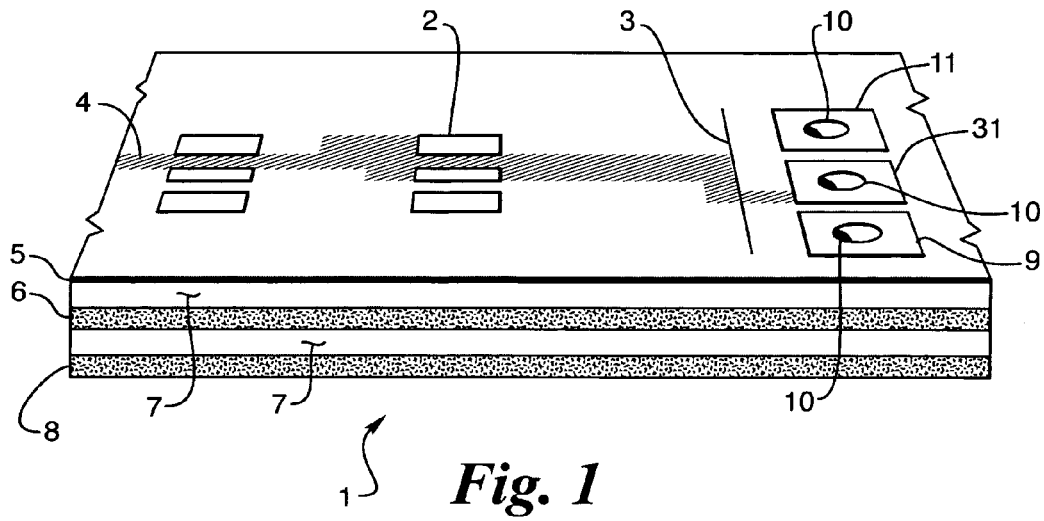
FIG. 1 shows a top and cut away view exposing layers of a circuit board with connection pads in an embodiment of the present invention.

The following discussion is presented to enable a person skilled in the art to make and use the present teachings. Various modifications to the illustrated embodiments will be readily apparent to those skilled in the art, and the generic principles herein may be applied to other embodiments and applications without departing from the present teachings. Thus, the present teachings are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of the present teachings. Skilled artisans will recognize the examples provided herein have many useful alternatives and fall within the scope of the present teachings.

Embodiments of the present invention described below conceive numerous designs and methods to reduce energy consumption, enable better control, increase reliability and reduce manufacturing costs. The system cost reductions further enable the adoption of SSL in a variety of applications, thus, reducing global energy consumption.

Embodiments of the present invention include novel techniques and circuitry to power and discretely control the light output of SSL light emitters, and to enable direct connection to conventional AC dimming controls, benefiting a wide variety of SSL applications.

In reference to the present invention, individual or groupings of SSL emitters, forming a circuit or array of circuits, include a novel circuit which is used to selectively turn on or dim either individual or groups of emitters in response to voltage change. The present invention relates to a design and method of controlling light emitters so as power supply voltage is raised, the emitters or ballast devices will turn on in sequence. Further, with the addition the invention as described here can be directly controlled for light output (intensity and optionally color) from conventional AC and DC power sources including devices such as rheostats, voltage controlled transformers or TRIAC chopping circuits.

Embodiments of the present invention described below show simple and energy efficient novel circuits and methods for light control (dimming), and allow for intentional control of light color. Further, the circuits are compatible with both DC and AC power sources and are directly compatible with common AC voltage controls and dimmers.

Embodiments of the present invention include alternative circuit designs and methods of powering and controlling SSL emitters in conjunction with rectification, current regulation, and/or ballast resistors, to optimize energy use and efficiency, as well as enabling important functions such as dimming and selective emitter and color control. These novel circuit designs and methods work effectively with a variety of SSL emitters and can be implemented within printed circuit assemblies and electronic wiring systems in many shapes, sizes and configurations.

Embodiments of the current invention as described below include individual circuits, circuit assemblies, arrays and systems including a discrete control circuit used to selectively turn on or off either individual or groups of emitters or ballast resistors used in SSL lighting applications. Embodiments of the present invention relate to the design and method of controlling light emitters so as power supply voltage is raised, the emitters will turn on in sequence. Further, with the addition of a rectifier or bridge rectifier, and if connected to an AC source, some of the embodiments as described here can be directly controlled for light output (intensity and color) from conventional AC dimming circuits such as rheostats, voltage controlled transformers or TRIAC chopping circuits.

Embodiments of the present invention include the use of voltage thresholds derived from a shared voltage reference to individually turn on a series of electronically controlled switches (optionally in combination with a traditional current limiting circuit feeding the emitters individually or in strings or in parallel strings) or turn on the emitters in sequence as the voltage is raised. This allows precise sequence control (as would be needed in a bar graph) or precise ordering control (as needed to light various areas of a sign), or color change sequencing.

The voltage reference used in creating the thresholds for turning on the switches can be the power supply itself, or optionally an independent voltage source used specifically for dimming control. Use of the power supply voltage as the dimming control voltage source has the benefit of simplicity and minimizes the number of interconnects.

In several tests and through the evaluation of several designs of high power solid state lighting (SSL) systems using LED emitters, the inventors have found three issues frequently recur which are not well addressed in the industry.

First, it is difficult to control the light output of SSL, emitters, especially high power LEDs, as a simple function of circuit voltage. LEDs are highly non-linear in response to voltage having a minimum onset voltage for many high power LEDs in the range of 2 to 3 volts and a very rapid building of current (and light output) after reaching this voltage. Further, from LED to LED and lot to lot, the onset voltages and light output as a function of a voltage vary significantly. Attempts to control LEDs using voltage alone often result in little or no response until a specific voltage is reached for the LED (or string of LEDs) and then increases rapidly until saturation. As the LED approaches saturation, waste heat increases which can damage the device. An example voltage response curved is found in the data sheet for a CREE XRE type emitter. Some LED control circuits use series resistors with the LEDs to extend the response range and as a control of current. However, this approach is very wasteful of energy as the resistors convert electrical energy into waste heat. As an alternative, variable current controls have been developed to take advantage of an LED's more linear output response as a function of current. However, these implementations are generally more complicated, requiring additional components and circuitry, and can be quite wasteful of energy. Further, current controlled designs require repetition each time another string of LEDs is to be added to the fixture, adding to cost and footprint. Another type of light output control uses a combination of either a fixed voltage or a fixed current control circuit and a switching element rapidly turns on and off the LED(s) in what is called pulse width modulation (PWM). These circuits make use of visual persistence and/or phosphor persistence to try to level out the light, but often have some degree of flicker associated with them.

The second issue associated with control of LEDs, especially those used in lighting applications, is many existing circuit designs implementing light output control (such as dimming the LEDs) do so by wasting energy. Resistive networks used in dimming convert electrical power into waste heat. DC power supplies are not ideally matched to the voltage drop of the emitter circuit (having a higher voltage than needed in an installation) and cause the circuit to burn off energy in waste heat.

The third issue is white light LEDs, particularly those which incorporate phosphors for absorption and re-emission of light generated in one color or frequency and outputting in another, suffer color shift as a function of output intensity, especially as they are operated at highest and lowest intensity. Lighting control and dimming circuits move an LED (or string of LEDs) up and down through intensity by either changing current or voltage will affect light color.

The described invention uniquely addresses all three of the issues discussed above. It focuses primarily on SSL applications using LEDs, but is applicable to other types of SSL emitters as well.

Embodiments of the current invention contain circuitry to monitor the voltage of the connected power supply to control the number of SSL emitters currently enabled in each string in accordance with the available voltage. This allows solid state emitters to be discretely turned on as a function of voltage, enabling a type of step-wise linear control. The approach is benefited by simplicity and a highly linear response as each emitter adds a discrete amount of light, and reduction or elimination of unwanted color shift. Further, the approach can be extended to AC as well as DC applications and into applications where voltage may be changed in accordance with available power sources.

With reference to FIG. 1, a top and cut away view exposing layers of a circuit board with connection pads in an embodiment of the present invention is shown. The circuit board 1 can have two electrically conductive layers 6, 8 with an electrical isolating material 7 sandwiched in between. The inventors chose the electrically conductive layers to be 2 oz. copper to carry high currents associated with SSL high power emitters. The inventors also chose the inner insulating layer to be 0.012 inch thick fiberglass composite material. Circuit paths of various designs can be etched into the top and bottom conductive layers 6, 8 to produce the circuit conductive paths 4. Plated through holes 10 can be added to join conductive paths or pads etched from the conductive layers. Additional thin layers of non-conductive solder repelling material 5 (solder masks) can be added to the top and bottom of the board 1 to restrict the movement of solder and protect the circuit paths. The solder mask 5 is interrupted to expose conductive pads 2 for mounting electronic components, as well as pads 9, 11 and 31 used for interconnect (circuit board to circuit board) or for power supply input, control input, or circuit to circuit interconnect. On top of the solder mask 3, visible markings may be printed consisting of text and other circuit markings. In one embodiment, two pads are provided for power supply connection. The first pad 11 receives positive voltage or AC voltage. The second pad 9 is the return path for the power supply. Additional pads 31 may be additionally used for control signal input or output.

The constructed circuits may receive AC or DC voltages for power.

SSL emitter arrays constructed as described are supportive of high light outputs in very small areas. In an array construction using NICHIA NS6W083A high intensity LED emitters, the light output per square foot is greater than 1680 lumens, which compares to conventional fluorescent fixtures producing approximately 500-800 lumens per square foot.

Figure 2:
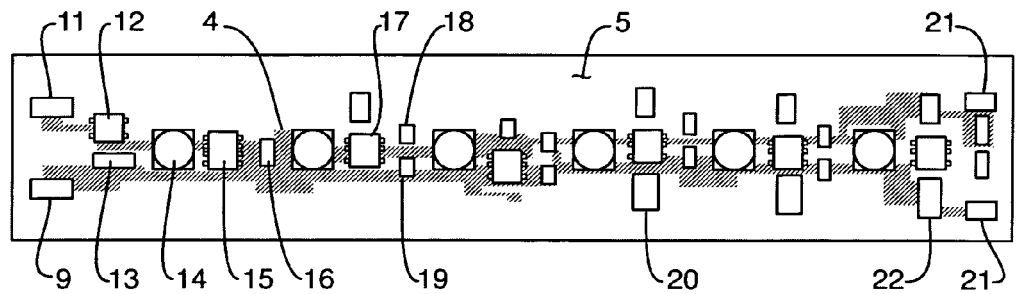
FIG. 2 shows a top view of an assembled circuit board in an embodiment of the present invention.

With reference to FIG. 2, in one embodiment of the present invention, an assembled printed circuit board is shown with six SSL, emitters mounted on it. Two conductive pads 9, 11 are used to supply power to the circuit. Two additional pads 21 are optionally used to connect to another circuit or assembly, transmitting the power supply to the next circuit. A transient voltage suppression device (in this embodiment a Fairchild Semiconductor SMBJ36CA TVS) 13 connects to the power pads preventing damage from high voltage transients. In one embodiment, a full wave rectifier bridge 12 accepts AC power input from the power pads. Alternatively a half wave rectifier may be used. No rectification is needed for DC power input. In the same embodiment a current regulator 15 (On Semiconductor NUD4001) is used in conjunction with a feedback resistor 16 to control the maximum current through a connected chain of emitters. This simple circuit sets a fixed and optimal current through the string of emitters, maintaining accurate light output and color. The first emitter in the chain 14 is linked serially to additional emitters and an optional series ballast resistor 20. In this embodiment, MOSFET switches 17 (On Semiconductor FDC3601N) are used to selectively shunt current to the return path. A voltage divider network constructed with resistors 19 is used to establish the power supply voltage levels will turn off the MOSFET switches in response to supply voltage levels. Pull up resistors 18, keep the MOSFET switches active and shunting current when the voltage divider supplied input is not sufficient to shut off a switch. In this embodiment, two MOSFET devices are used in tandem to implement the complete MOSFET switch. The first MOSFET turns on when the gate voltage elevates to about 2.6 volts, conduction current between drain and source reducing the drain voltage to nearly zero. The second MOSFET receives input from the first MOSFET and turns off when the first MOSFET is on. When off, the second MOSFET stops current flow from drain to source. The inventors have chosen MOSFET switches in this embodiment although it is recognized a variety of devices could have been used to achieve the same function—including operational amplifiers, JFETs, transistors, etc. MOSFETs were chosen because of their current carrying ability, low on resistance, and gate threshold voltage at which they can be turned on. The MOSFETs are used to switch current from a segment of the emitter string back into the return path, thereby effectively turning off all emitters behind them. Further, the present invention can be implemented with a high side (positive voltage side) regulator design (as in the embodiments described above), or a low side regulator design—with only simple circuit modifications. Further, it is recognized a separate voltage control signal (other than the power supply voltage) could have been used as an input to gain similar function in place of connecting the voltage divider network to the power supply.

Figure 3:
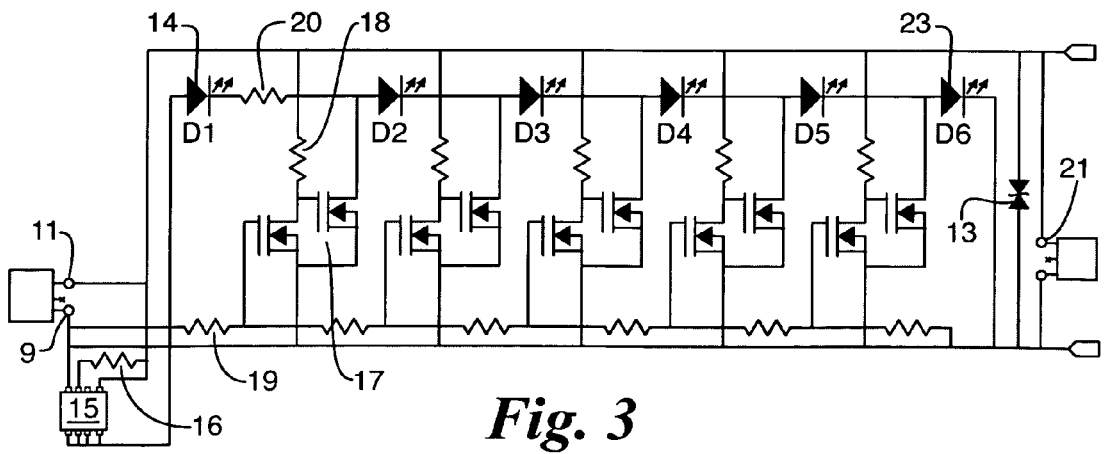
FIG. 3 shows the schematic of a circuit powering and controlling multiple SSL emitters in an embodiment of the present invention.

With reference to FIG. 3, a similar embodiment is shown in schematic form—omitting the bridge rectifier (which is not needed when a DC power supply is used). In this embodiment the voltage divider string is composed of six resistors 19, feeding five MOSFET switches. Further, these five switches subsequently turn on or off five of the emitters. In this implementation only the first emitter in the string 14 (D1) is not controlled by a MOSFET switch.

As shown in FIG. 3, a series of MOSFET switches are used in pairs attached between the emitters. These pairs enable flow of current to the power supply return and turn off the flow of current when input voltage is high enough. Each of the MOSFET switches is attached to a voltage divider network starting with connection to the power supply high end voltage and ending at the return supply connection. Choice of the resistor values (R3-R13) determine the desired turn off points of each MOSFET switches. The function of this circuit is to turn on emitters one at a time as the voltage supply rises. Each MOSFET switch can be removed from the circuit without harming function of the rest of the circuit, so individual or groups of emitters may be controlled.

Figure 4:
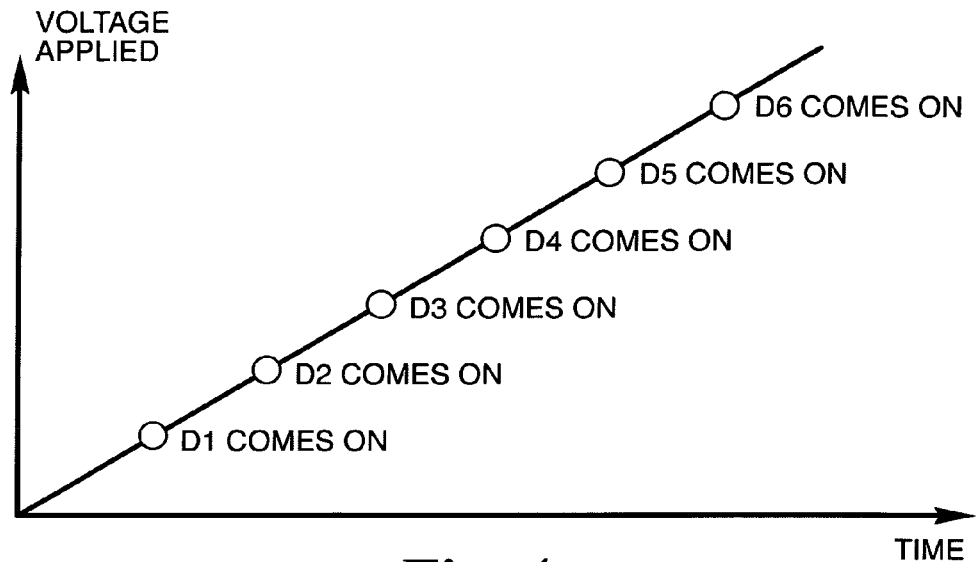
FIG. 4 shows a graph illustrating the control sequence of emitters as they turn on as a function of input voltage applied to an embodiment of the present invention.

With reference to FIG. 4, a graph is shown depicting the effect of changing input voltage to the embodiment described in FIG. 3. As input voltage is raised, the first emitter (D1) receives current as the first MOSFET switch provides a return for current directly to the power supply return. At a selected threshold (determined by the voltage divider network resistor values), the first MOSFET switch is turned off, allowing current to pass though the second emitter (D2) returning through the second MOSFET switch. Each of the MOSFET switches is turned off sequentially at different threshold voltages, turning on associated emitters. At the highest voltage threshold the final emitter (D6) is turned on.

In the above referenced embodiment, 0 to 24 VDC was used as the input voltage. Further, the current regulator was set to 350 mA. CREE XRE white LED emitters were used. The voltage divider network resistor values were calculated so each subsequent emitter was turned on in reference to the input power supply voltage at an increment equal to the expected Vf of the emitter at 350 mA. The second emitter was turned on in reference to the input power supply voltage starting at Vf (for the first emitter) plus the voltage drop across the regulator for 350 mA operation.

In this and similar embodiments, the divider network resistors were chosen to turn on additional emitters at increments matching the Vf of the emitter when operated at the desired current and output illumination level. In this and similar embodiments, whenever enough voltage is available to add another emitter to the string without affecting the output of the others, another threshold is reached and another emitter is turned on. It is recognized the first emitter could have been kept off by one additional MOSFET pair and divider resistor, if it is desirable to have no light until the first emitter can be fully turned on (at the regulated current).

The turn-on thresholds are arbitrary, but in many applications it will be desirable to keep a general linear trend between voltage and light output. Therefore, switching would be set in uniform steps so each step represents the same increase in light. Alternatively non-linear or special steps may be implemented. Further, because the circuit can skip several emitters, larger steps in output can be implemented.

The described implementation can be easily modified to use an independent control voltage sourcing the voltage divider instead of the power supply voltage. This is beneficial to allow external control of the emitter turn on sequence. Further, a variable current source or resistance can be added to the resistor divider chain to adjust the general bias of the threshold chain for the purpose of compensating or calibrating differences in Vf between emitter lots, or variance device to device in voltage drops across the regulator.

A helpful aspect of the present invention is it works in parallel with a conventional SSL emitter drive circuit. Additional circuitry may be incorporated into existing LED circuit designs to affect the control of one or more emitters in each string. Further, once designed into the emitter circuit, components may be selectively assembled or not assembled to provide the light output (dimming) control feature.

As a part of the present invention, the inventors conceive of similar circuits where the current is fed into the string through MOSFET or other device switches, and for which any current regulation is conducted at the current return end of the emitter string. Further, it is conceived the voltage reference turning on each switch may be derived either from the power supply directly or from a rectified power supply derived from the primary supply, or from a separate control input. Further, it is conceived the voltage reference may be derived from a photo sensor, thermal sensor, or other sensing devices incorporated into the circuit.

Figure 5:
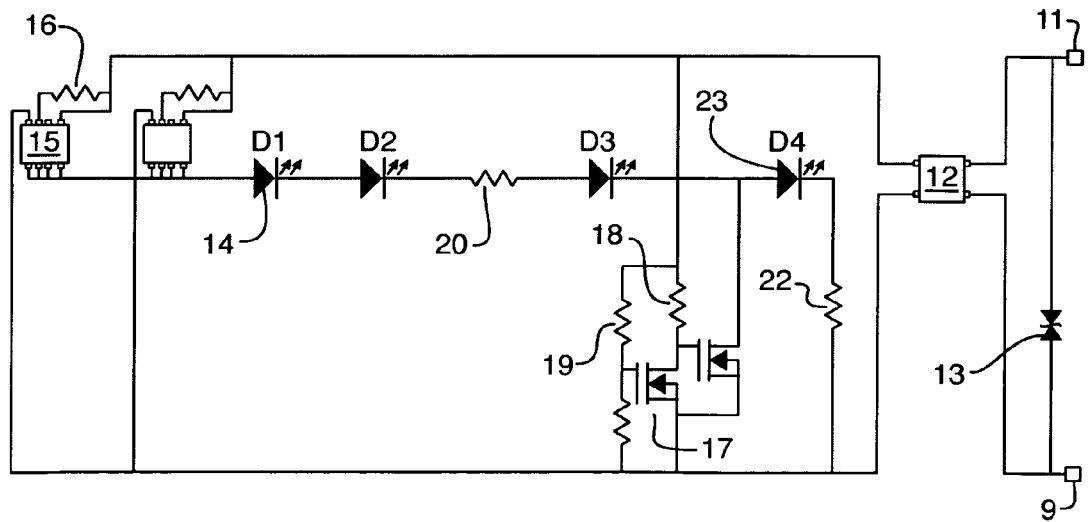
FIG. 5 shows a schematic including four emitters and full wave rectification of the voltage input in another embodiment of the present invention.

With reference to FIG. 5, an alternate embodiment is shown in schematic form showing four emitters of which only the last emitter 23 is turned on and off by a MOSFET switch 17. In this embodiment, AC input is accommodated by a full wave bridge rectifier 12. In this embodiment, AC current was used as the power input.

Figure 6:
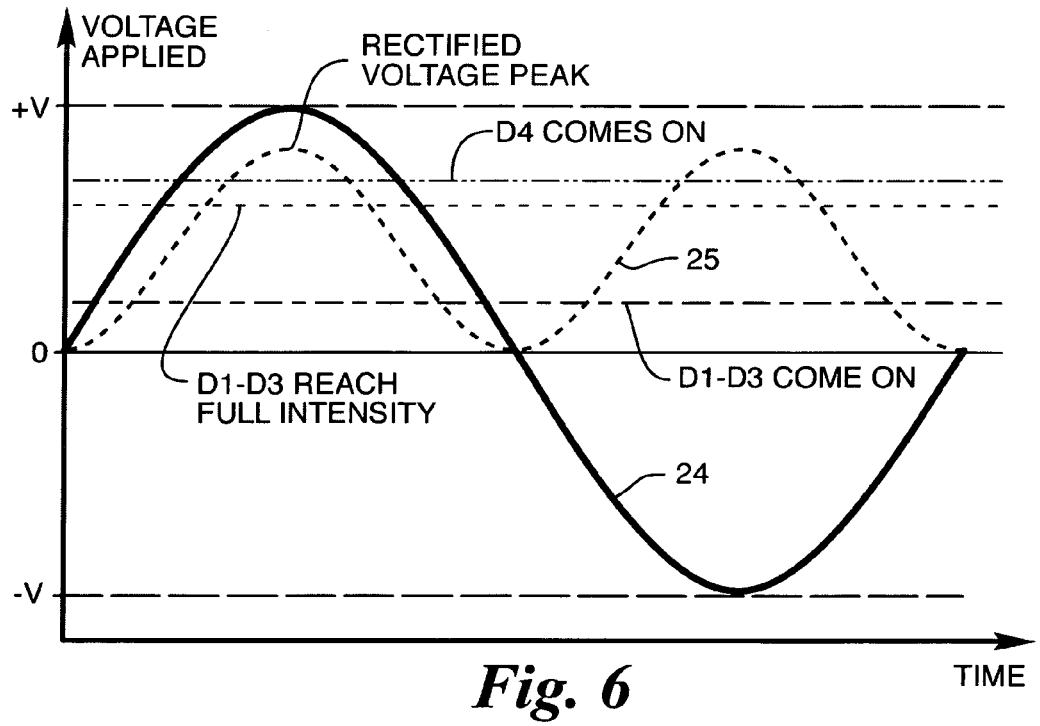
FIG. 6 shows a graph illustrating the control sequence of emitters as a function of AC input voltage applied to an embodiment of the present invention.

With reference to FIG. 6, a graph is shown depicting the effect of changing input voltage to the embodiment described in FIG. 5. In this graph, the input power voltage 24 is compared to the post rectification voltage 25. The post rectification voltage in turn supplies the current regulator 16 to power the emitter string. FIG. 6 shows the threshold level in relation to the post rectification voltage 25 at which the first three emitters (D1 to D3) come on and eventually reach full current and intensity, and the threshold at which the fourth emitter (D4) is turned on.

In the above referenced embodiment, 0 to 12 VAC was used as the input voltage. Further, the current regulation was set to 500 mA, as the parallel combination of the two current regulators feeding 250 mA each. CREE MCE white LED emitters were used. The voltage divider network resistor values were calculated so the fourth emitter was turned on in reference to the input power supply voltage at the level of 3 times Vf (reflecting the sum of the first three emitters Vf's at 500 mA) plus the voltage drop across the regulators for 250 mA operation plus the voltage drop across the rectifier at 500 mA.

The inventors conceive alternate forms of current regulation may be used within the present invention, including resistive, linear regulators, and switching regulators. Further, the inventors also conceive a wide variety of AC and DC power supplies may be used, at different voltages, currents, and at different AC frequencies.

Figure 7:
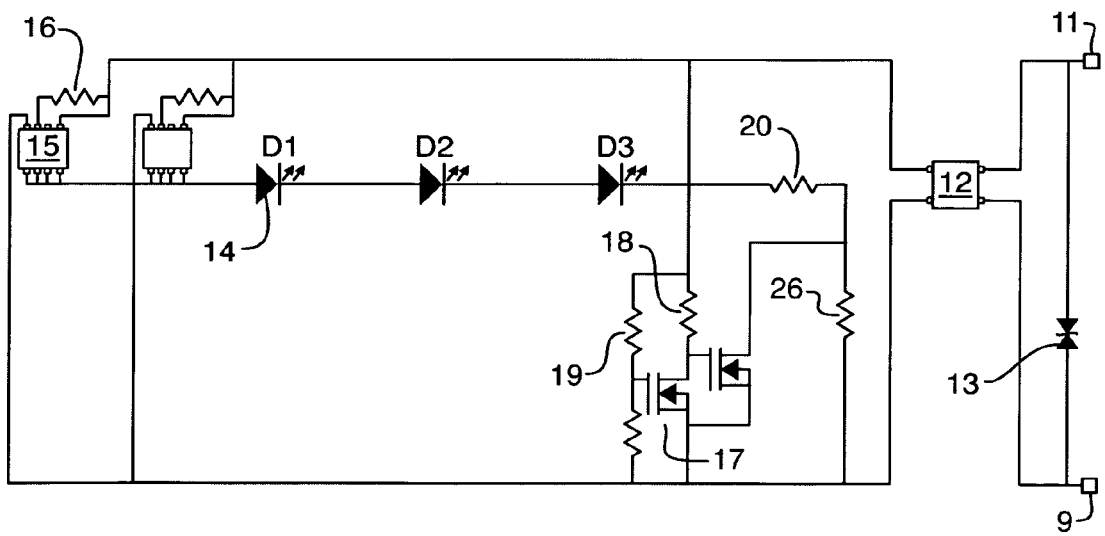
FIG. 7 shows a schematic including three emitters, a switched ballast resistor, and full wave rectification of the voltage input in another embodiment of the present invention.

With reference to FIG. 7, an alternate embodiment is shown in schematic form showing three emitters in which only the final ballast resistor 26 is turned on and off by a MOSFET switch 17. In this embodiment, AC input is accommodated by a full wave bridge rectifier 12. In this embodiment, AC current was used as the power input.

Figure 8:
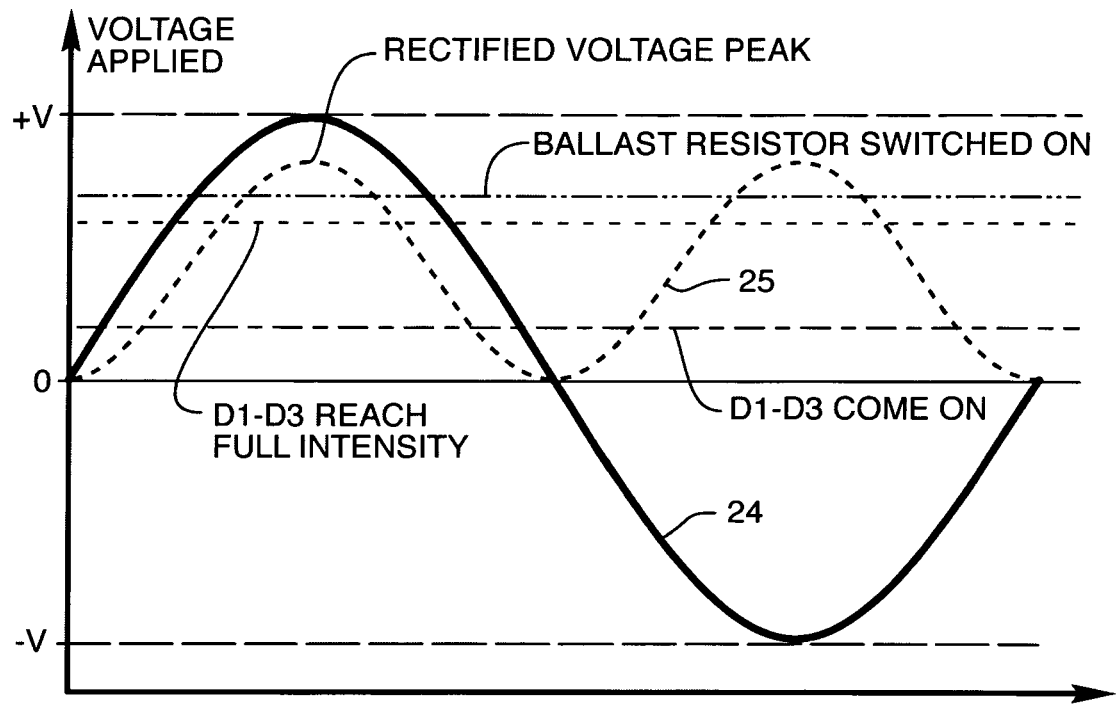
FIG. 8 shows a graph illustrating the control response of the ballast resistor as a function of AC input voltage applied to an embodiment of the present invention.

With reference to FIG. 8, a graph is shown depicting the affect of changing input voltage to the embodiment described in FIG. 7. In this graph, the input power voltage 24 is compared to the post rectification voltage 25. The post rectification voltage in turn supplies the current regulator 16 to power the emitter string. FIG. 6 shows the threshold level in relation to the post rectification voltage 25 at which the three emitters (D1 to D3) come on and eventually reach full current and intensity, and the threshold at which the ballast resistor (D4) is turned on.

In the above referenced embodiment, 0 to 12 VAC was used as the input voltage. Further, the current regulation was set to 500 mA, as the parallel combination of the two current regulators feeding 250 mA each. CREE XPE white LED emitters were used. The voltage divider network resistor values were calculated so the ballast resistor was turned on in reference to the input power supply voltage at the level of 3 times Vf (reflecting the sum of the first three emitters Vf's at 500 mA) plus the voltage drop across the regulators for 250 mA operation, plus the voltage drop across the rectifier at 500 mA.

The inventors conceive the switched ballast resistor may be placed anywhere in the current flow chain. Further, the ballast resistor may be replaced by any component or circuit reflecting a predictable voltage drop with current applied, including zener diodes, thermistors and other components and circuits.

Figure 9A:
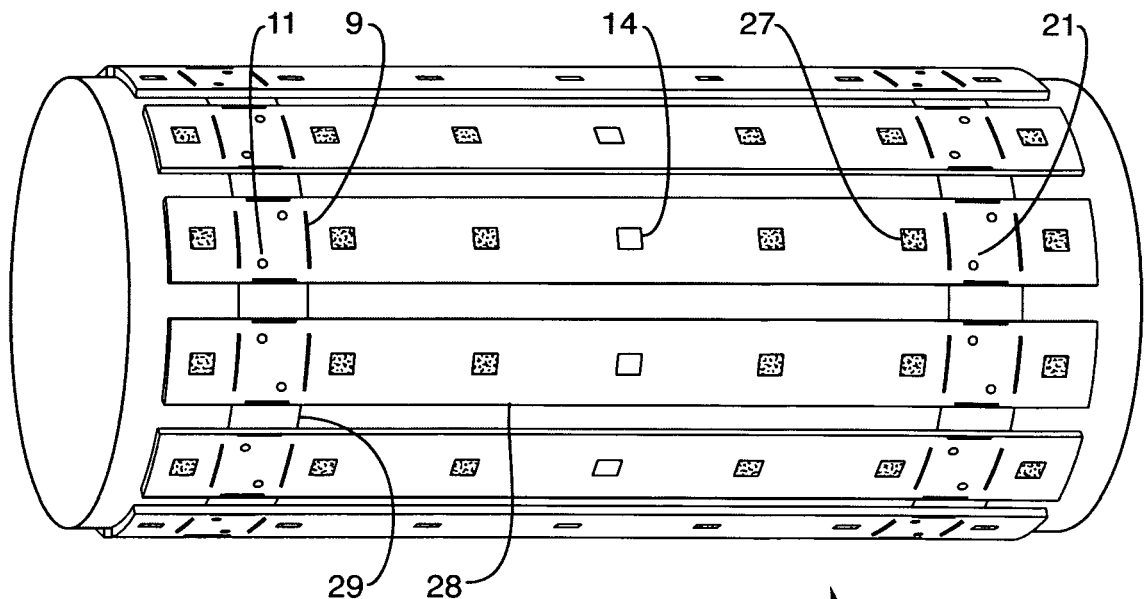
FIG. 9A shows a view of a cylindrical assembly of circuit boards with some emitters switched on in an embodiment of the present invention.
Figure 9B:
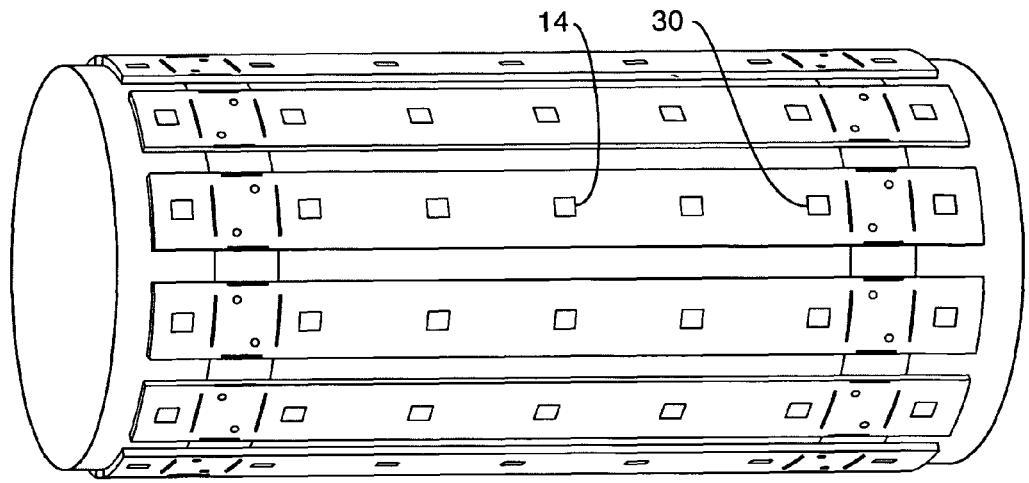
FIG. 9B shows a view of a cylindrical assembly of circuit boards with all emitters switched on in an embodiment of the present invention.

With reference to FIG. 9A, an array of circuit boards wrapping around a cylindrical heat sink is shown. In this embodiment of the present invention, several circuit boards as described in FIGS. 1, 2, 3, and 4 are interconnected by a conductive strip 29 which supplies power through pads 9, 11 on each board. The first circuit board 1 shares power and functions similarly to connected boards 28. At low input voltage, one or more emitters 14 on each board are on. FIG. 9B shows the same embodiment with all of the emitters 30 switched on when enough voltage is received.

Figure 10A:
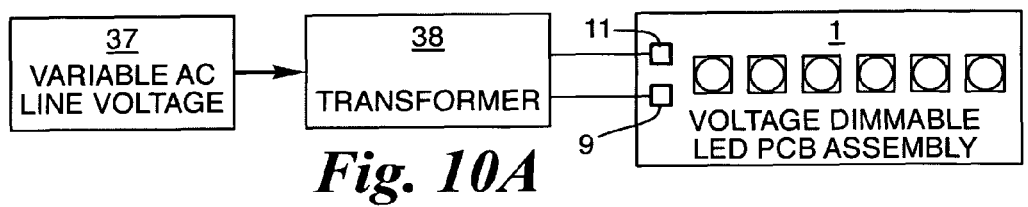
FIG. 10A shows a block diagram depicting a dimmable system with AC voltage input using an embodiment of the present invention.

With reference to FIG. 10A, the rectification enabled embodiments described above may be powered with AC current through a transformer 38. This may be a magnetic transformer, electronic transformer, or regenerator. The source power for the system originates from a higher voltage AC source 37, which may be variable in amplitude. In one embodiment, a Lutron model GLV600 magnetic dimmer was used to vary the AC voltage into a simple step down (120 VAC to 12 VAC) transformer enabling a dimming range of 5% to 100% light output.

Figure 10B:
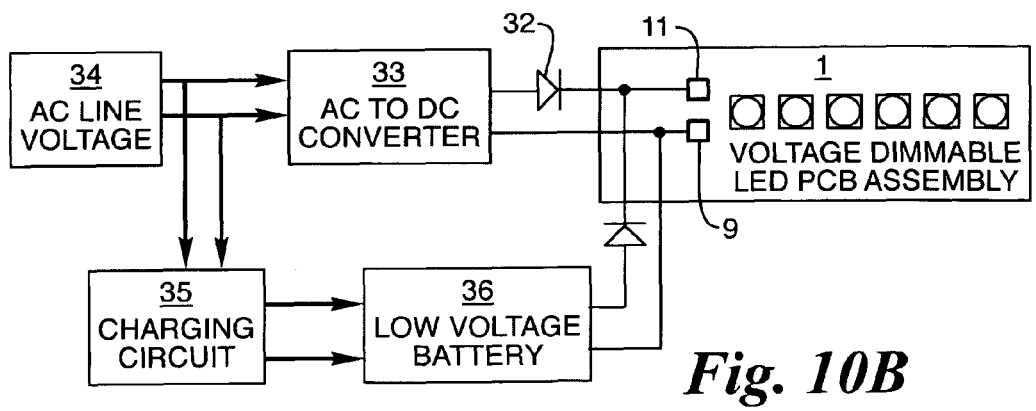
FIG. 10B shows a block diagram depicting a battery backed up emergency/safety light system using an embodiment of the present invention.

With reference to FIG. 10B, the embodiments described above may be used to implement an emergency/safety light system. Primary voltage can be provided by as AC to DC power supply converter 33 operating from an high voltage AC source 34. Back up voltage can be provided by a low voltage battery 36 charged from the primary circuit 35 or by any type of emergency supply. Diodes 32 are used to prevent backwards current flow into either source. In this system, the SSL circuit assembly 1 will turn on as many emitters as can be effectively powered from the backup power source when the primary source is not available.

Figure 11A:
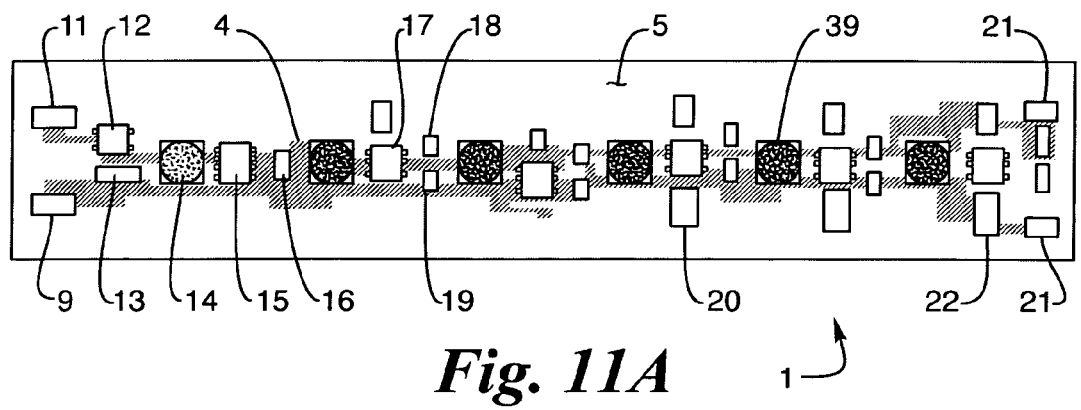
FIG. 11A shows a top view of a printed circuit board assembly with two emitter colors, one of which is switched on, in an embodiment of the present invention.
Figure 11B:
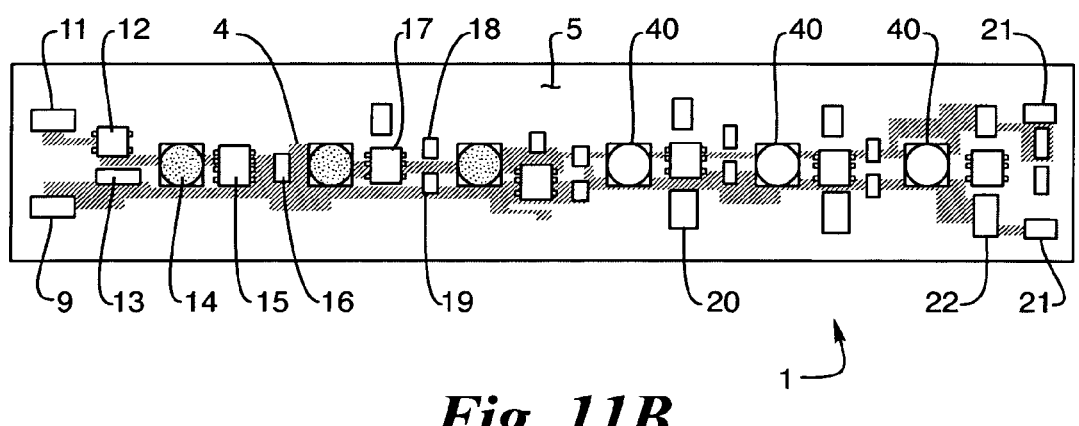
FIG. 11B shows a top view of a printed circuit board assembly with two emitter colors, with all of the emitters switched on, in an embodiment of the present invention.

With reference to FIGS. 11A and 11B, an embodiment of the present invention is shown with a mix of two emitter colors. The circuit assembly 1 at low voltage turns on one or more emitters 14 of an initial color while the other emitters 39 remain off. As the voltage is raised, additional emitters 40 are turned on with a second color. In one embodiment, Nichia model NS6x083A emitters with color temperature 3000K were used as the first three emitters in sequence, and Nichia 6000K emitters were used as the second three. Variable AC voltage was applied. At low voltage (dimmed) the result was a low level of warm light—similar to a dimmed incandescent bulb. At higher voltage the light transitioned to a brighter, cooler white. At highest voltage, the color mix approached a bright 5000K, and could be used as a bright task light.

The inventors conceive multiple colors of emitters, and multiple intensities, may be used in accordance with the present invention. Further, multiple circuits, sharing a single power supply or control signal may have different combinations of color and intensity emitters to create desired light output effects.

The described circuits and methods of light control work especially well with existing designs having current regulating devices (semiconductor regulators or series resistance) in series with each LED emitter string. Having a current regulating device allows each emitter, as it is turned on, to have a predictable and controlled light output.

The embodiments of the present invention, by matching the number of enabled emitters to the available voltage, can be highly energy efficient by minimizing voltage drop across non-light producing power components.

Further, it is often the case for systems experiencing voltage loss through corroding connections, variable lengths of wiring, degradation or variation of the power supply, to be designed with adequate voltage margin to prevent the voltage seen at the emitter circuits from ever falling below a level would cause the emitters to rapidly loose light output. In installations absent worst case degradations in voltage, the voltage margin becomes a circuit drop in the light fixture converting power into waste heat. Embodiments of the present invention, including switches applied to one or more emitters at the end of the string, is highly beneficial as they turn off one or more emitters to preserve the light output of the emitters remain on. Therefore, power and voltage systems can be designed with lower overheads to conserve energy.

In one embodiment, the inventors modified a conventional circuit in accordance with the current invention used a string of six emitters with a combined Vf of 19.0 volts and had required a nominal power supply of 24 volts DC to accommodate possible line voltage losses through connectors and wiring (owing to variations in installation) which were budgeted up to 2 volts. The circuit had included a ballast resistor and a linear current regulator, where the ballast resistor would reduce voltage drop across the current regulator if the supply voltage of 24 volts DC was fully realized to the circuit. By installing a MOSFET switch across the ballast resistor, in accordance with the current invention, the power supply voltage could be safely dropped to 22 volts (at the same current) saving 8% in energy use. It was possible to reduce the power supply size because in the case of 2 volts of budgeted lined line voltage loss, the ballast resistor would be switched out of the circuit. Therefore the circuit would safely maintain adequate voltage across the emitters for full output at the lower voltage.

Threshold levels for embodiments can be chosen to either optimize the turning on of the next emitter(s) in sequence after full current would be available for emitter, or the turning on of the next emitter(s) in sequence so the light output total remains approximately constant during transition, or the turning on of the next emitter(s) so the light output drops slightly during transitions. Each of these optimizations is enabled by setting the thresholds (voltage divider resistance values) in relation to the Vfs of the emitters at the current operating points desired at transition.

The inventors conceive threshold levels need not be set by a resistive network; they can be set by a series of voltage reference devices (e.g., zener diodes) or in relation to the upstream voltage of any upstream emitter in the string. In this way circuit implementations may be created better track and correct for variable Vfs of installed emitters.

The described invention includes the ability to precisely turn on emitters in controlled sequences benefiting visual graphics applications such as signage, marquees applications, and control of task lighting. In one embodiment the present invention was used to first turn on one emitter and then a group of three. This produced the effect of a low level of light followed by full light as the voltage was changed.

Embodiments of the present invention can, as voltage is increased, change the color mix of turned on emitters. Specific emitters of varying colors can be positioned in emitter strings so the controlled sequence would turn on emitters so to precisely control color mixes at each stage in voltage. This is extremely beneficial in applications where it is desirable to cast a warm (reddish) light color as the lights begin to come on, transitioning to a cooler brighter (bluish) light at full intensity. It is also beneficial when special lighting effects, such as the transition of a primary light color to blended light color is desired (example: green plus red produces yellow).

Embodiments of the present invention are generally simple and reliable, involving a minimum set of components. Less reliable capacitors and inductors are avoided. Microcontrollers and pulsed switching devices are avoided. Circuits can be easily designed to be compatible with single sided SMT production methods. Further, the lack of inductors and capacitors, which tend to be tall devices on SSL circuit boards, decreases the overall height and reduces problems with components causing light interference and shadowing in SSL lighting assemblies.

As described, embodiments of the present invention can be constructed by a repeating combination of components and geometry to constrict larger lighting systems with power and control characteristics of the individual circuit.

Embodiments of the present invention are ideally suited for incorporation into narrow circuit board strips with emitters spaced in the long axis. The fact each current switch can be paired with the emitter, without additional parallel wire paths minimizes interference with conductor sizes and paths. Because the voltage divider and switches are in parallel to the emitter string, they do not interfere with the heavy thermal traces and routings commonly used in SSL, circuit design and can be implemented in a single layer SMT design.

Thin circuit board strips embodying the present invention can be assembled into arrays of all types, sizes and configurations.

Embodiments of the present invention include a method for dimming responding to voltage steps with highly reproducible color and light output levels.

The inventors conceive in accordance with the present invention, a reverse sequence row of emitters may be used to stabilize the light output per unit length or area constructed. A third row will further improve light uniformity. This technique is particularly useful in spiral patterns used in larger area lights or spot lights, or in matrix or grid patterns.

Embodiments of the present invention can operate entirely on two conductors as provided by the power supply connection. This presents helpful advantages to cost, simplicity, space, and obviates the need for a separate control connection.

Embodiments of the present invention can be equipped with front end half or full wave rectification or driven directly by an alternating current voltage supply. Because the system self adjusts for the voltage present at each moment of an AC input, it maximizes utilization of available voltage and power and minimizes energy losses to heat.

As described, embodiments of the present invention can be connected to a conventional AC dimming control connected to line voltage (rheostat, variable transformer, SCR or TRIAC chopping dimmer, etc.), in series with a voltage reducing transformer (if needed for smaller strings of emitters), to effect a fully dimmable SSL light source.

Highest efficiency (and device protection from over current) can be achieved if circuit embodiments of the present invention are connected to a rectified AC source. A simple current limiting device can be used without concern for over voltage and thermal damage with the AC waveform. As the voltage rises with the AC waveform, more and more emitters are turned on, maintaining current and also stabilizing the voltage drop across the current limiting device. Further, as described, additional ballast resistors can be switched into the circuit to further limit current and distribute thermal loads. Therefore, full efficiency is gained in the system while minimizing thermal concerns for the current limiting element.

Embodiments of the present invention can be very efficient as they effectively limit power loss in the current regulating device (or circuit) to no more than the amount needed before the next emitter can be added. In one tested embodiment, this method and circuit reduced the thermal losses by over 40% compared to a simple rectification circuit. In the tested embodiment, with sinusoidal voltage input (AC), emitters were turned on and off in sequence tracking the available momentary voltage. Therefore forward drop on the current regulating device was limited to an average of approximately ½ of the Vf of the individual emitters. In one test, and without the switching circuit, at the highest voltage level of the AC cycle, a voltage drop of as much as 3 times Vf was measured across the current limiting device. Instantaneously, 6 times as much power was being converted into heat at the current regulator when compared to the embodiment from the present invention.

Embodiments of the present invention operate without overheating or shutdown in changing voltage and brown out conditions. Also, with either DC or AC power supply connection, the present invention supports two or more discrete light output settings, each with its own brightness and color selection.

The present invention as described above can be implemented with more than one light output level, one of which is set to a level of light for emergency or safety lighting. In an emergency lighting system, a second voltage source (generally a battery) is used to power a low level of lighting when the main power source has been interrupted. The system and circuit implementations described above can accept AC and DC or both, enabling the system to be used for both full and safety lighting without a parallel system.

In summary, embodiments of the present invention exhibit several major advantages in SSL applications:

Dimming is both linear and highly reproducible (alternative direct voltage and current supply dimming is highly non-linear for SSL emitters).

Implementations are simple and reliable (with no need for a separate digital controller as would be needed for a pulse width modulated dimming system).

Works with existing high voltage A/C dimming controls (when implemented with simple transformer and rectification).

Gives addressability to the emitters (so they can be turned on in groups or in individual sequence).

Utilizes a simple two wire power supply, with or without an additional control signal, which can now control a large number of individual or grouped emitters.

It allows several fixtures to be exactly matched (within the limits of the emitters themselves) as to light output and color at each level of output.

The invention claimed is:

1. A solid state lighting circuit, comprising:
a plurality of emitters operably connected to a power supply;
the power supply operably coupled in series with a current limiting device;
a plurality of switched circuits, where one or more of the emitters is bypassed with each of the switched circuits;
wherein a controlling signal for the switched circuits to bypass one or more of the emitters is derived from the voltage of the power supply and increased applied voltage results in fewer emitters being bypassed.

2. The circuit of claim 1, wherein the power supply is operably connected to an AC power source.

3. The circuit of claim 1, wherein each switched circuit comprises at least one MOSFET switch.

4. The circuit of claim 1, wherein a plurality of emitters can be dimmed.

5. The circuit of claim 1, the plurality of emitters connected in series with one another.

6. The circuit of claim 1, wherein the power supply is operably connected to a DC power source.

7. A solid state lighting circuit, comprising:
a plurality of emitters operably connected to a power supply; and
the power supply operably coupled in series with a current limiting device, where one or more ballast resistors can be bypassed with a switched circuit,
wherein the switched circuit bypasses the one or more ballast resistors until the power supply reaches a threshold voltage.

8. The circuit of claim 7, wherein the plurality of emitters can be bypassed with the switching circuit.

9. A solid state lighting circuit, comprising:
a plurality of emitters operably connected to a power supply path;
a plurality of switches, the switches arranged in parallel with one or more of the plurality of the emitters in order to bypass one or more of the plurality of emitters by shunting current back to a power return path when the switches are activated; wherein the number of switches activated to bypass emitters is dependent on the voltage of the power supply path; wherein the number of switches activated decreases as the voltage of the power supply path increases.

10. The circuit of claim 9, the emitters having a minimum onset voltage to produce light, wherein the number of emitters reaching the minimum onset voltage increases as the voltage of the power supply path increases.

* * * * *